(12) United States Patent
Yee et al.

(10) Patent No.: US 7,285,434 B2
(45) Date of Patent: Oct. 23, 2007

(54) SEMICONDUCTOR PACKAGE AND METHOD FOR MANUFACTURING THE SAME

(75) Inventors: Kuo Chung Yee, Taipei (TW); Chun Chi Lee, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 147 days.

(21) Appl. No.: 11/074,796

(22) Filed: Mar. 9, 2005

(65) Prior Publication Data

US 2006/0202314 A1    Sep. 14, 2006

(51) Int. Cl.
*H01L 33/00* (2006.01)
*H01L 31/0224* (2006.01)

(52) U.S. Cl. .................. 438/26; 438/67; 257/E33.056; 257/E31.124

(58) Field of Classification Search .................. 438/26, 438/67, 68, 69, 71, 98, 456; 257/E33.056, 257/E33.062, E31.124
See application file for complete search history.

(56) References Cited

U.S. PATENT DOCUMENTS

| | | | |
|---|---|---|---|
| 6,040,235 A | 3/2000 | Badchi | |
| 6,117,707 A | 9/2000 | Badchi | |
| 2002/0019069 A1* | 2/2002 | Wada | 438/69 |
| 2003/0080434 A1* | 5/2003 | Wataya | 257/774 |
| 2003/0113979 A1* | 6/2003 | Bieck et al. | 438/411 |
| 2003/0231276 A1* | 12/2003 | Miki et al. | 349/149 |
| 2004/0075761 A1* | 4/2004 | Maeda et al. | 348/340 |
| 2004/0229405 A1* | 11/2004 | Prabhu | 438/123 |
| 2005/0258545 A1* | 11/2005 | Kwon | 257/777 |
| 2006/0043599 A1* | 3/2006 | Akram et al. | 257/774 |

* cited by examiner

*Primary Examiner*—Carl Whitehead, Jr.
*Assistant Examiner*—Jennifer M. Dolan
(74) *Attorney, Agent, or Firm*—Reed Smith LLP; Stanley P. Fisher, Esq.; Juan Carlos A. Marquez, Esq.

(57) ABSTRACT

A semiconductor package comprises a chip, a plurality of pad extension traces, a plurality of via holes, a lid and a plurality of metal traces, wherein the chip has an active surface, a back surface opposite to the active surface, an optical component disposed on the active surface, and a plurality of pads disposed on the active surface and electrically connected to the optical component; the pad extension traces are electrically connected to the pads; the via holes are formed through the chip and electrically connected to the pad extension traces; the lid is attached on the active surface of the chip; and the plurality of metal traces are disposed on the back surface of the chip, electrically connected to the plurality of via holes, and defines a plurality of solder pads thereon.

18 Claims, 22 Drawing Sheets

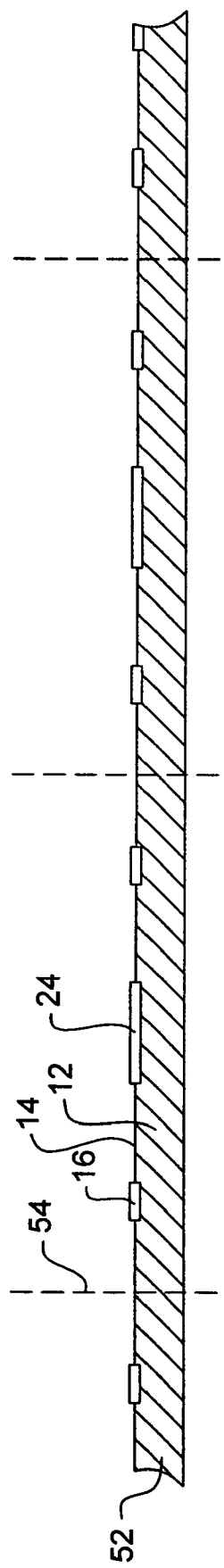
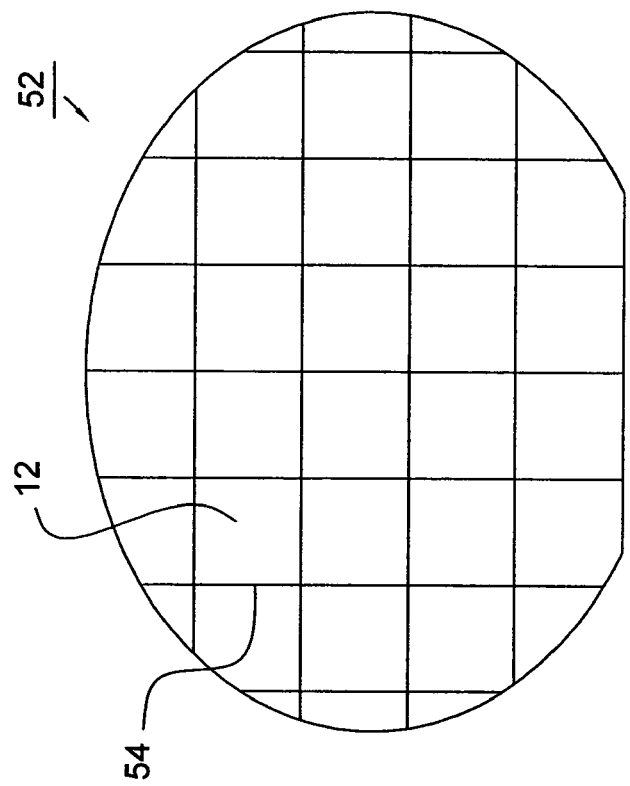
FIG. 2
FIG. 3

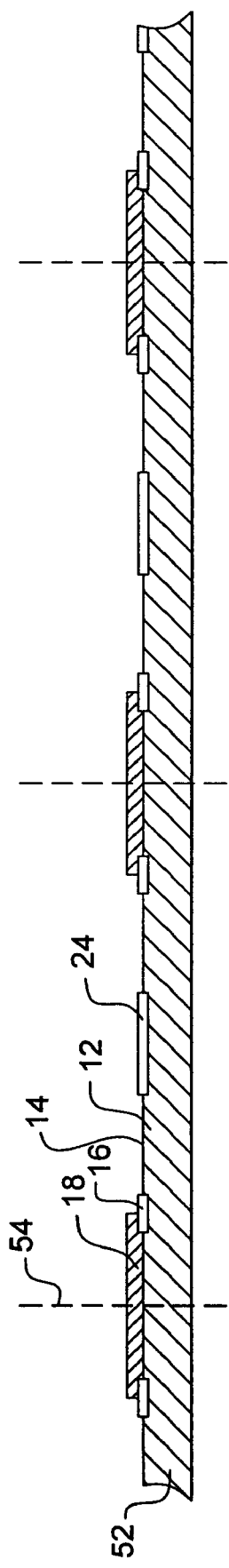
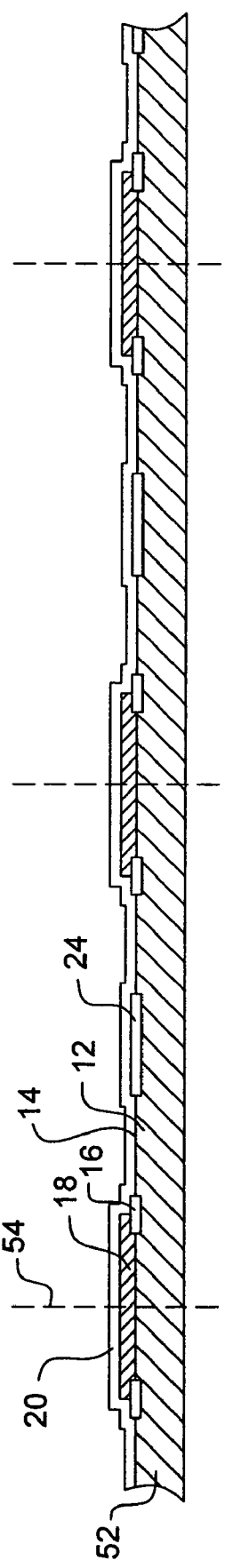
FIG. 4
FIG. 5

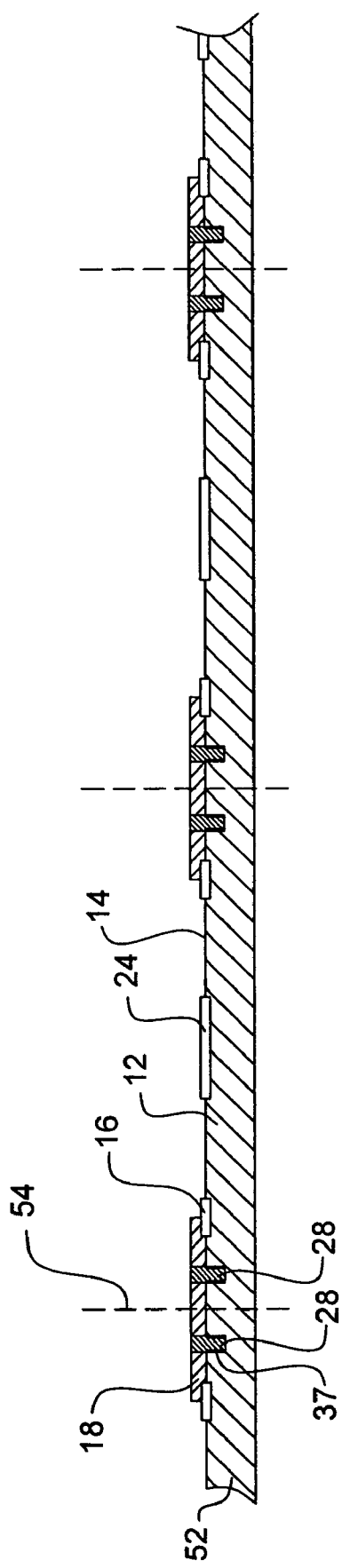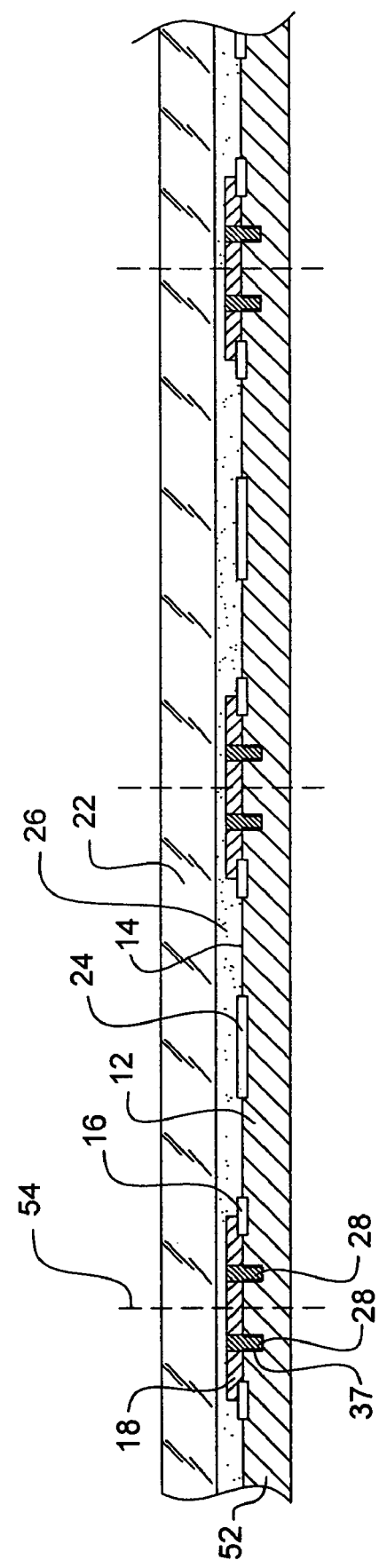

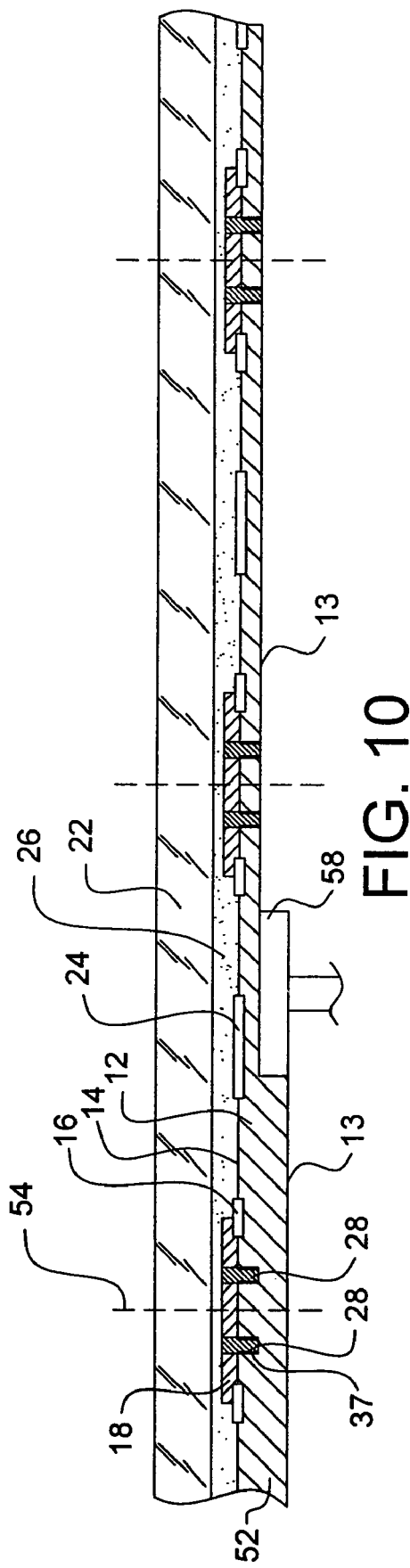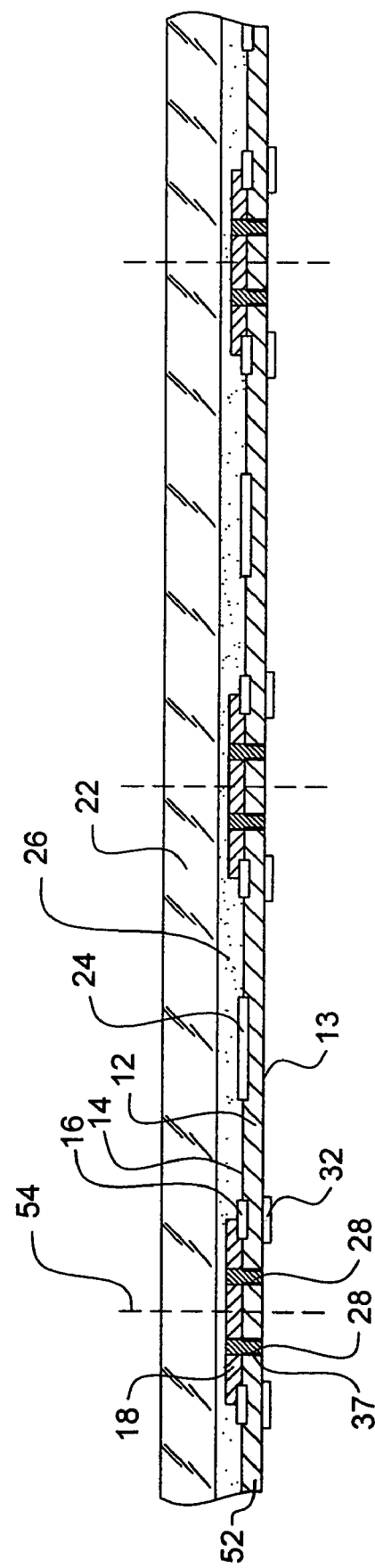

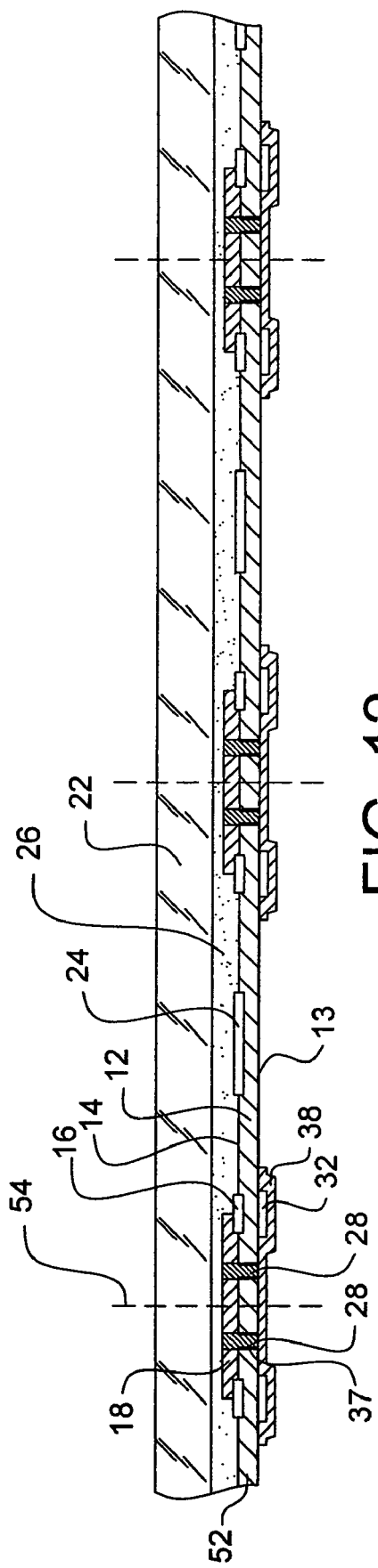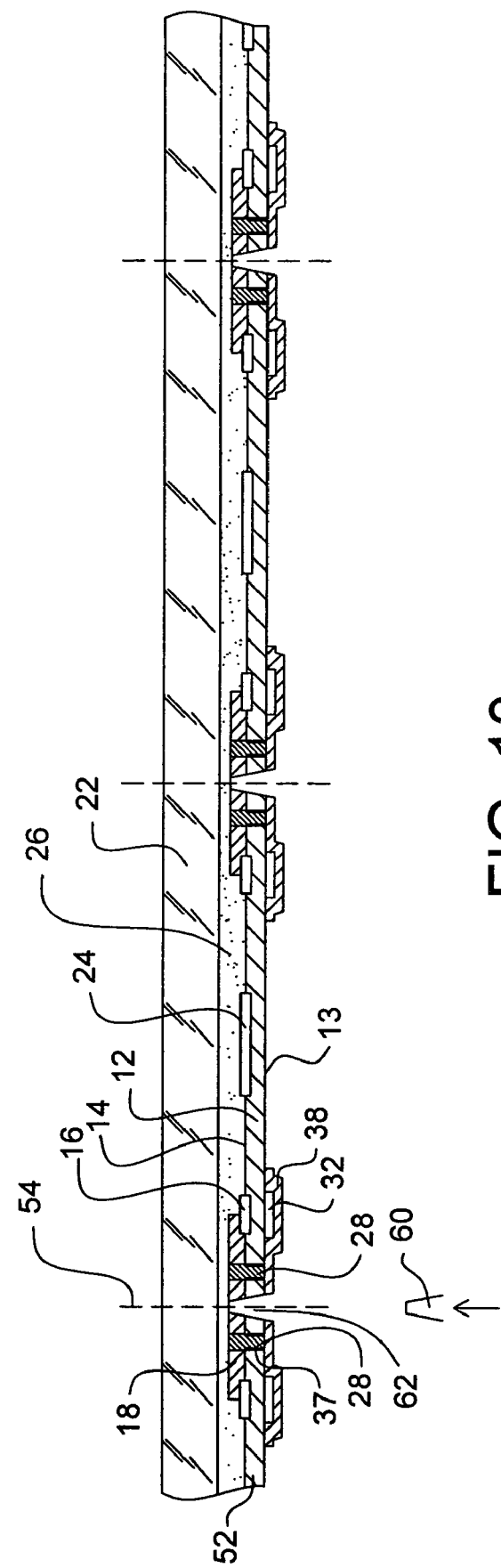

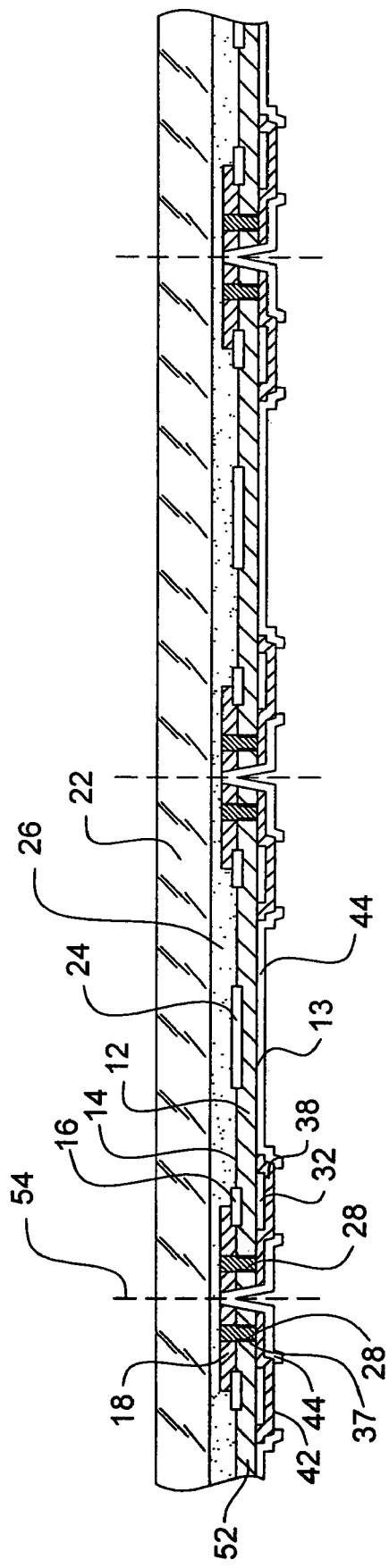
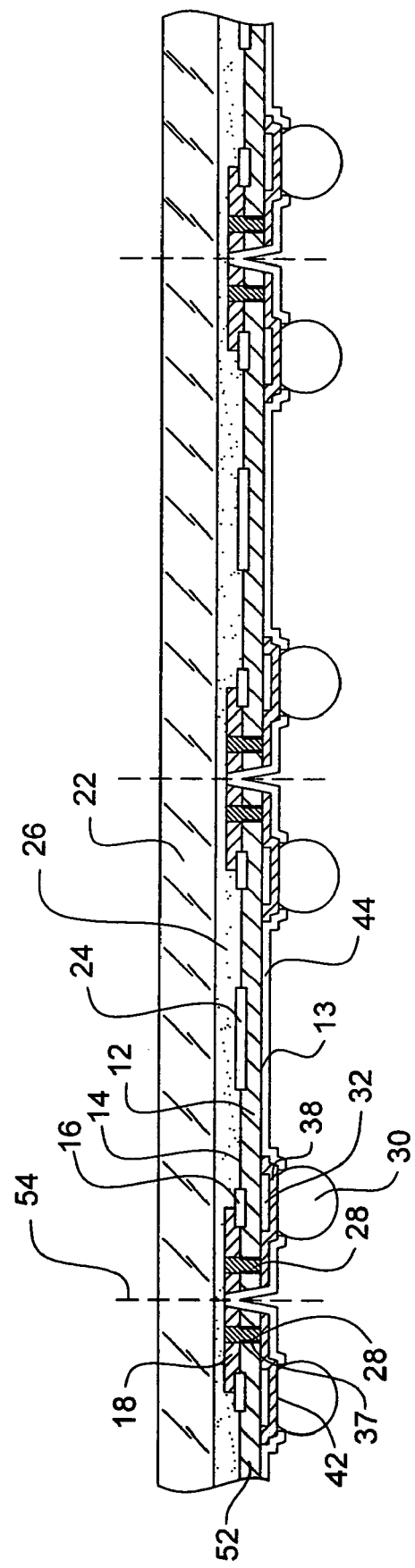

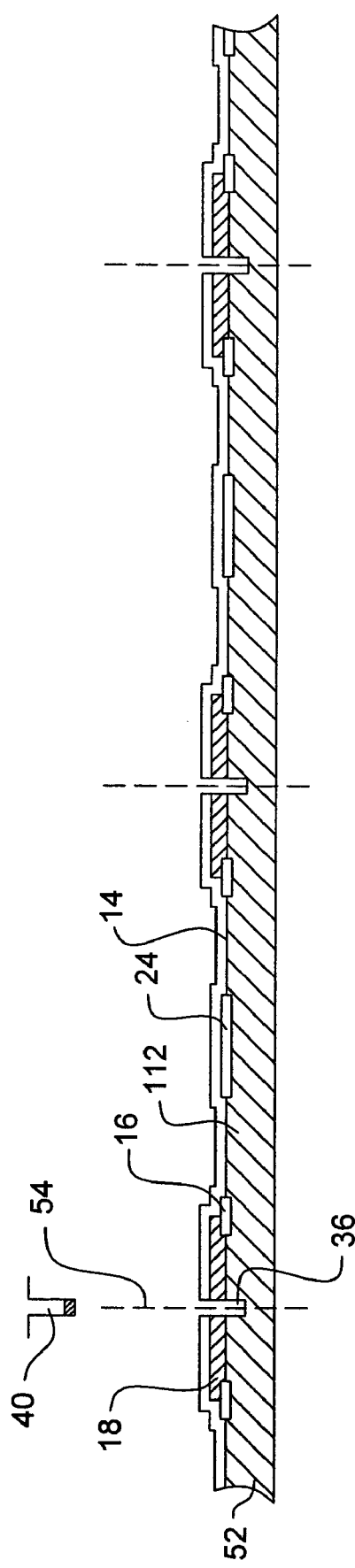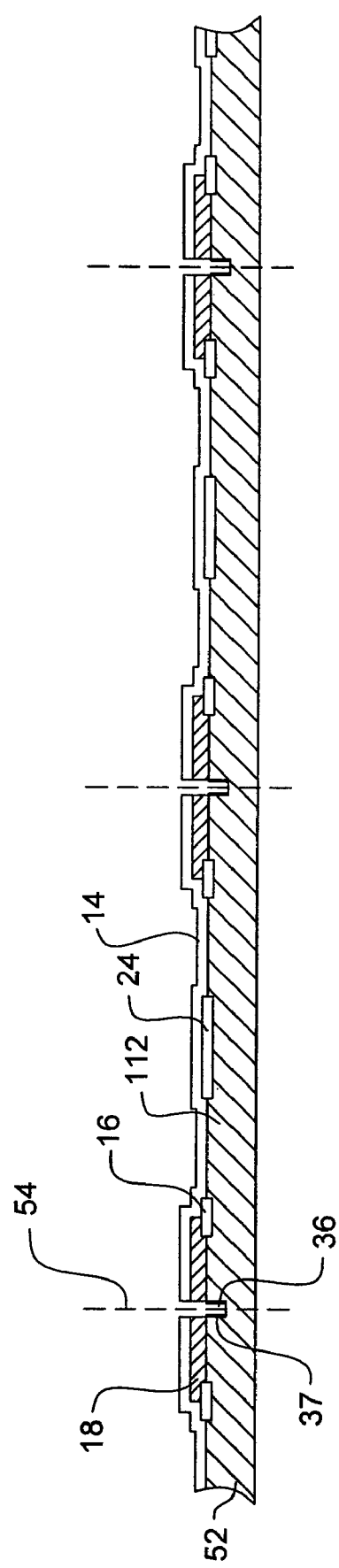

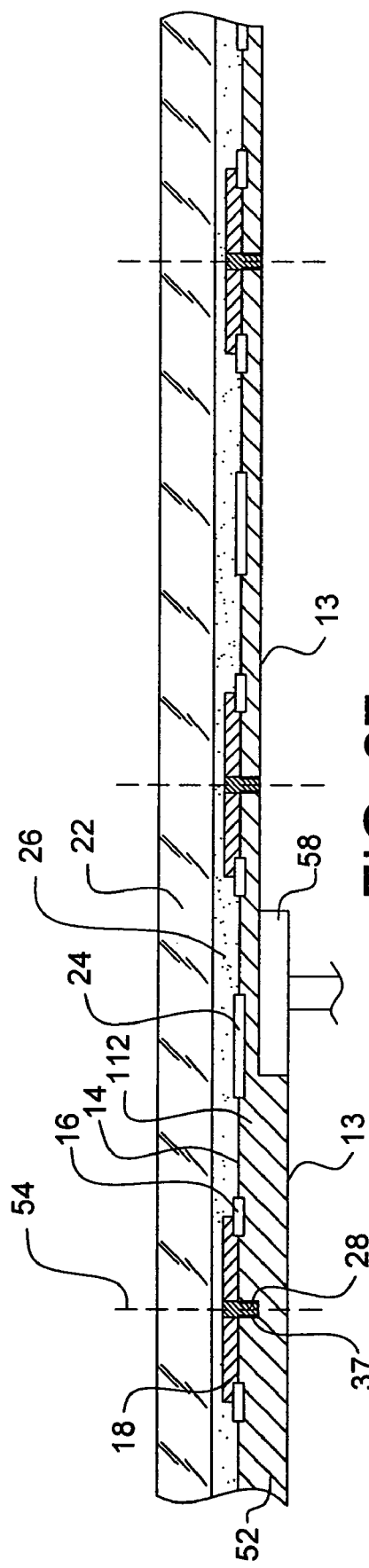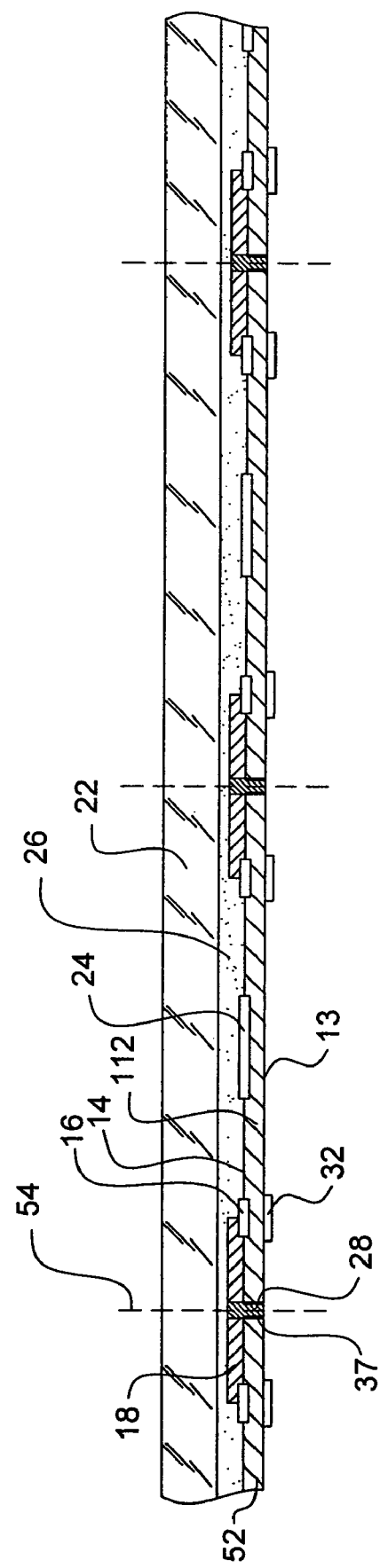

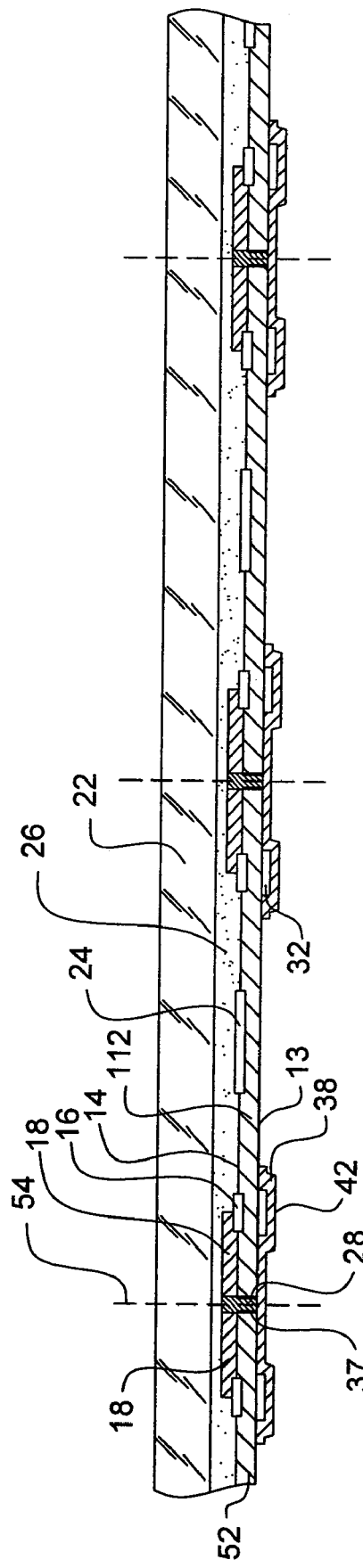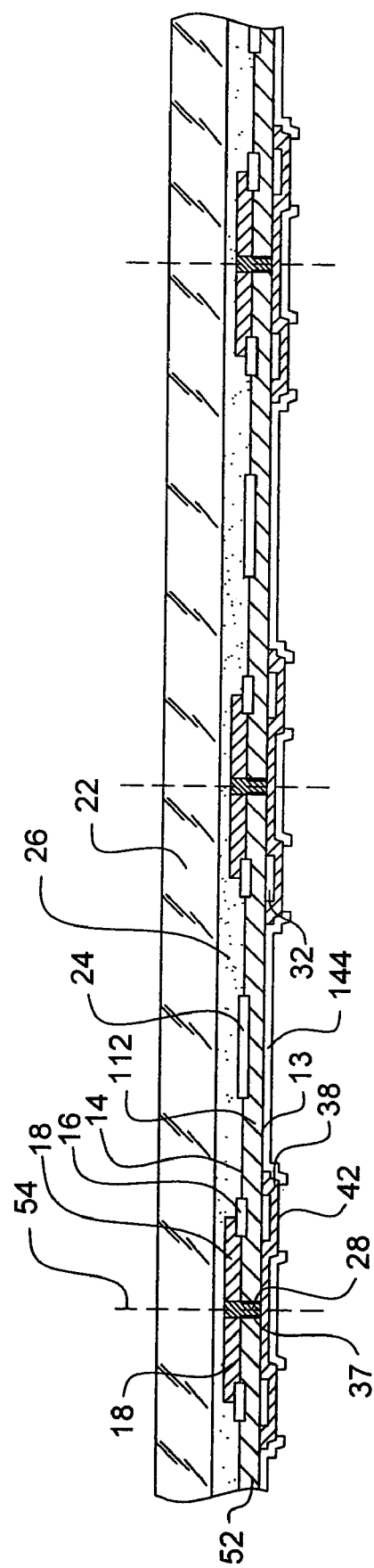

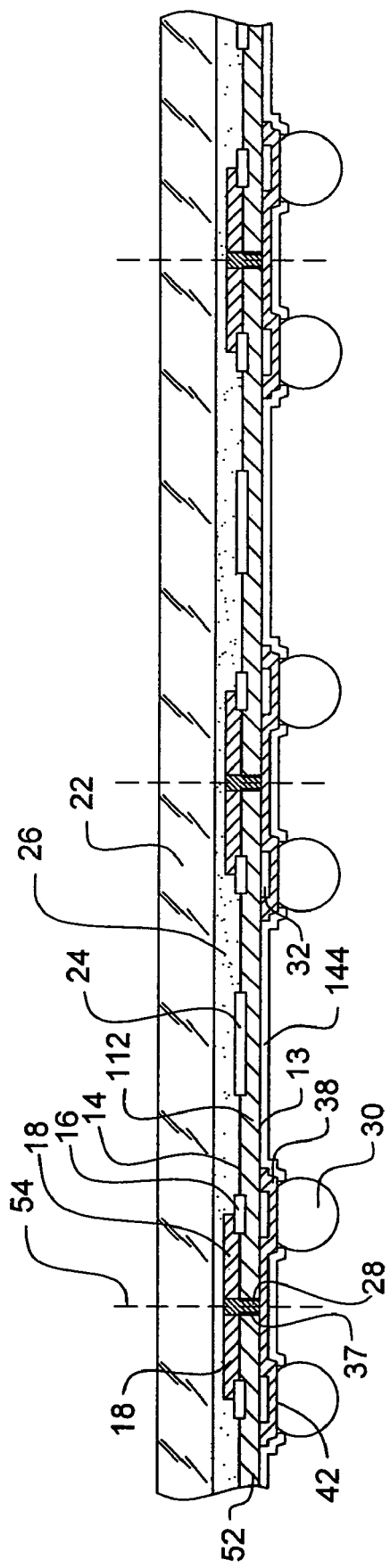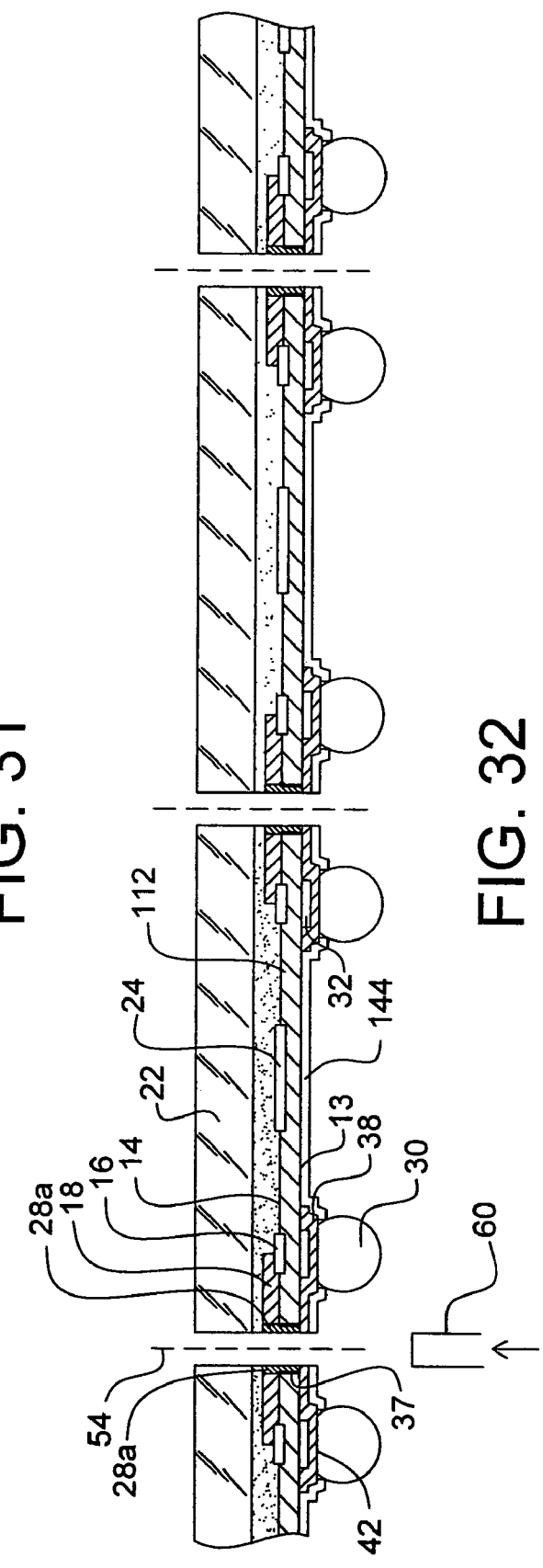

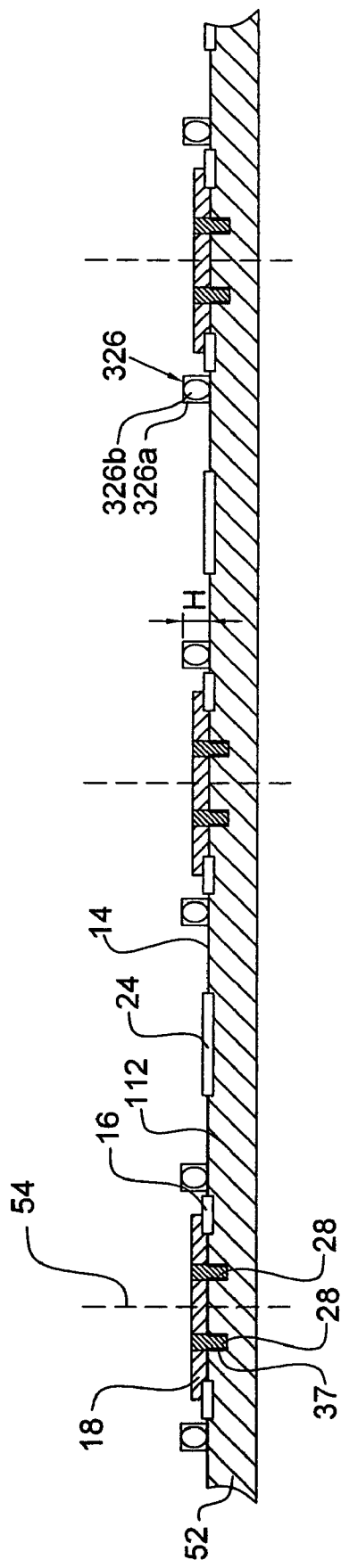
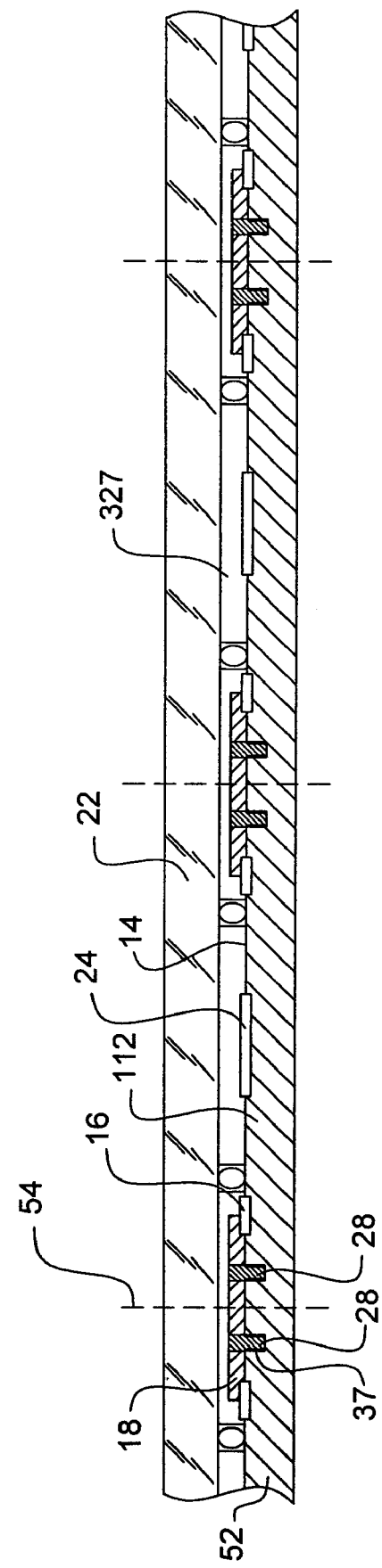
FIG. 35
FIG. 36

SEMICONDUCTOR PACKAGE AND METHOD FOR MANUFACTURING THE SAME

BACKGROUND OF THE INVENTION

1. Field of the Invention

This invention generally relates to a semiconductor package and a method for manufacturing the same, and more particularly to a wafer level semiconductor package and a method for manufacturing the same.

2. Description of the Related Art

The semiconductor package provides four functions, i.e. signal distribution, power distribution, heat dissipation and element protection. In general, a semiconductor chip is packaged into an enclosure (e.g. a single-chip module), and then disposed on a printed circuit board, together with other components, such as capacitors, resistors, inductors, filters, switches, and optical and RF components.

The complementary metal oxide semiconductor (CMOS) technology for making optical components is similar to that for making semiconductor chips. CMOS is typically formed by silicon (Si) and germanium (Ge) and generally includes NMOS (negative polarity) and PMOS (positive polarity) transistors. For optical components, NMOS and PMOS can generate currents after sensing light, and the currents are then recorded and read as image.

Further, as the demands for lighter and more complex electronic devices gradually increase, the operating speed and the complexity of IC chips have become higher and higher. Accordingly, a higher packaging efficiency is required. In the prior art, various semiconductor packages and manufacturing methods have been provided for improving the packaging efficiency and reliability. For example, U.S. Pat. No. 6,040,235 entitled "Methods And Apparatus For Producing Integrated Circuit Devices" issued to Badehi on May 21, 2000, and U.S. Pat. No. 6,117,707 entitled "Methods Of Producing Integrated Circuit Devices" issued to Badehi on Sep. 12, 2000 disclose methods for manufacturing the semiconductor packages. However, theses semiconductor packages and the manufacturing methods in the prior art still have many limitations and drawbacks, and therefore can not completely meet the requirements for semiconductor packages.

Accordingly, there exists a need for providing a wafer level semiconductor package to further meet the requirement for semiconductor packages.

SUMMARY OF THE INVENTION

It is an object of the present invention to provide a semiconductor package and a method for manufacturing the same, which can offer higher packaging efficiency and eliminate the limitations and drawbacks in the prior art.

In order to achieve the object, the present invention provides a semiconductor package comprising a chip, a plurality of pad extension traces, a plurality of via holes, a lid and a plurality of metal traces. The chip has an active surface, a back surface opposite to the active surface, an optical component disposed on the active surface, and a plurality of bonding pads disposed on the active surface and electrically connected to the optical component. The pad extension traces are electrically connected to the bonding pads. The via holes are formed through the chip and electrically connected to the pad extension traces. The lid is attached on the active surface of the chip. The plurality of metal traces are disposed on the back surface of the chip, electrically connected to the plurality of via holes, and defines a plurality of solder pads thereon.

The semiconductor package according to the present invention can be massively produced at wafer level, thereby reducing the packaging cost and improving packaging reliability.

BRIEF DESCRIPTION OF THE DRAWINGS

Other objects, advantages, and novel features of the present invention will become more apparent from the following detailed description when taken in conjunction with the accompanying drawings.

FIG. 2 shows a semi-finished wafer structure according to first embodiment of the present invention.

FIG. 3 shows a top view of the semi-finished wafer structure of FIG. 2.

FIGS. 4 to 15 illustrate a method for manufacturing the semiconductor package according to first embodiment of the present invention.

FIGS. 23 to 32 illustrate a method for manufacturing the semiconductor package according to third embodiment of the present invention.

FIGS. 35 to 38 illustrate a method for manufacturing the semiconductor package according to fourth embodiment of the present invention.

DETAILED DESCRIPTION OF THE PREFERRED EMBODIMENT

Figure 1:
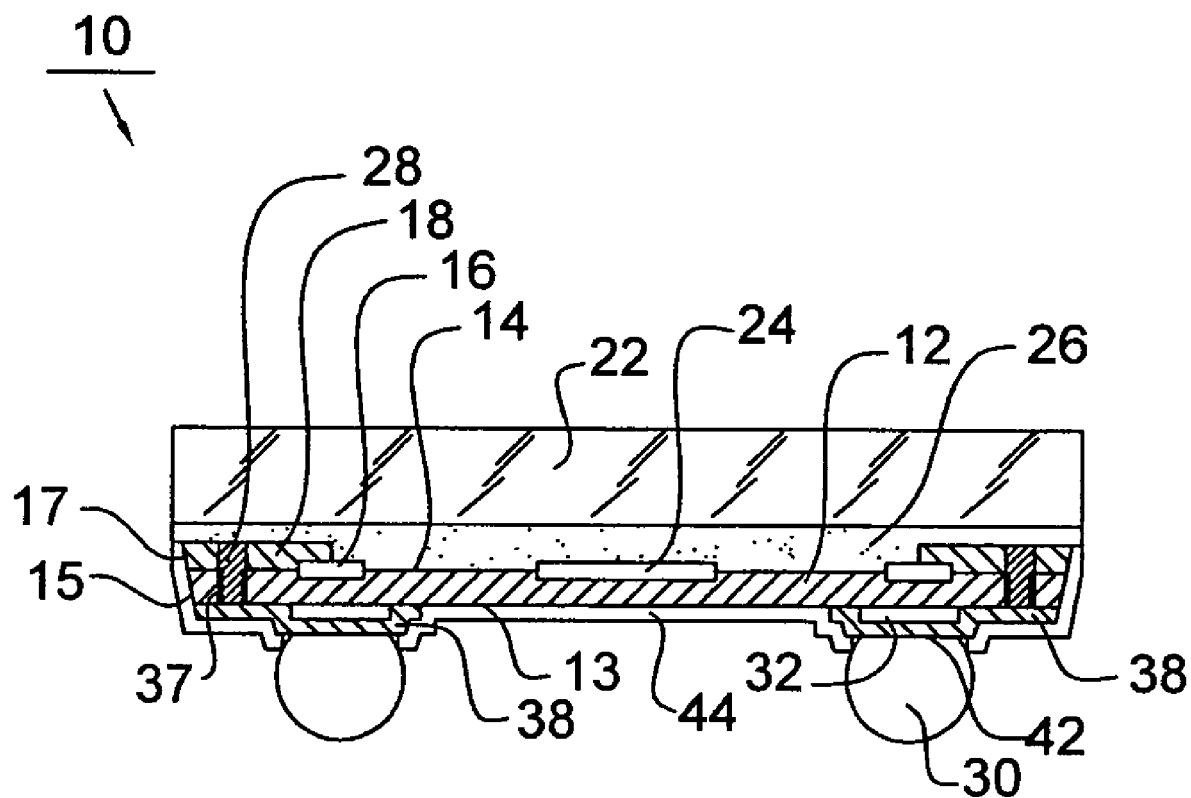
FIG. 1 shows a sectional view of a semiconductor package according to first embodiment of the present invention.

Now referring to FIG. 1, it shows a sectional view of a semiconductor package 10 according to first embodiment of the present invention. The semiconductor package 10 comprises a chip 12 having an active surface 14, a back surface 13 opposite to the active surface, an optical component 24 (e.g. sensor and photo coupler) disposed on the active surface 14, and a plurality of bonding pads 16 disposed on the active surface 14. The optical component 24 can be formed by complementary metal oxide semiconductor (CMOS).

The chip 12 further has a plurality of via holes 28 formed through the chip 12 and a plurality of pad extension traces 18 for electrically connecting the bonding pads 16 to the via holes 28. The semiconductor package 10 further comprises a lid 22 being attached on the active surface 14 of the chip 12 through an adhesive layer 26, and covering the active surface 14 and the plurality of pad extension traces 18.

The semiconductor package 10 further comprises a plurality of compliant pads 32, a plurality of metal traces 38, a solder mask 44 and a plurality of solder balls 30. The compliant pads 32 are formed on the back surface 13 of the chip 12. The metal traces 38 are formed on the back surface 13 of the chip 12 and the compliant pads 32. The solder mask 44 is coated on the back surface 13 of the chip 12 with parts of the metal traces 38 exposed therefrom, wherein the parts are defined as a plurality of solder pads 42. The solder balls are disposed on the solder pads 42 for being connected to an external circuit, e.g. a printed circuit board. The compliant pads 32 can be formed by photosensitive benzocyclobutene polymer so as to reduce the internal stress or thermal stress inside the semiconductor package 10. Further, the chip 12 and the pad extension traces 18 respectively have inclined side surfaces 15, 17, and the solder mask 44 can optionally cover the inclined side surfaces 15 of the chip 12 and the inclined side surfaces 17 of the pad extension traces 18. The solder mask 44 can be formed by photosensitive benzocyclobutene polymer. The via holes 28 are respectively and electrically connected to the pad extension traces 18 and the metal traces 38.

FIGS. 2 to 12 illustrate a method for manufacturing the semiconductor package 10 according to present invention.

As shown in FIGS. 2 and 3, a wafer 52 includes a plurality of chips 12 separated from one another by scribe lines 54. A plurality of bonding pads 16 are formed on the wafer 52.

Referring to FIG. 4, a plurality of pad extension traces 18 are formed on the wafer 52 through a RDL (redistribution layer) photolithography process and electrically connected to the bonding pads 16. An optical component 24 is disposed on the active surface 14 of the chip 12, and interacts with incident light or emits light.

Referring to FIG. 5, a photoresist 20 can be coated on the active surface 14 of the chip 12 so as to prevent contamination caused by next drilling process. It should be understood by the skill in the art that the step of coating the photoresist 20 on the active surface 14 is optional and not absolutely necessary.

Figure 6:
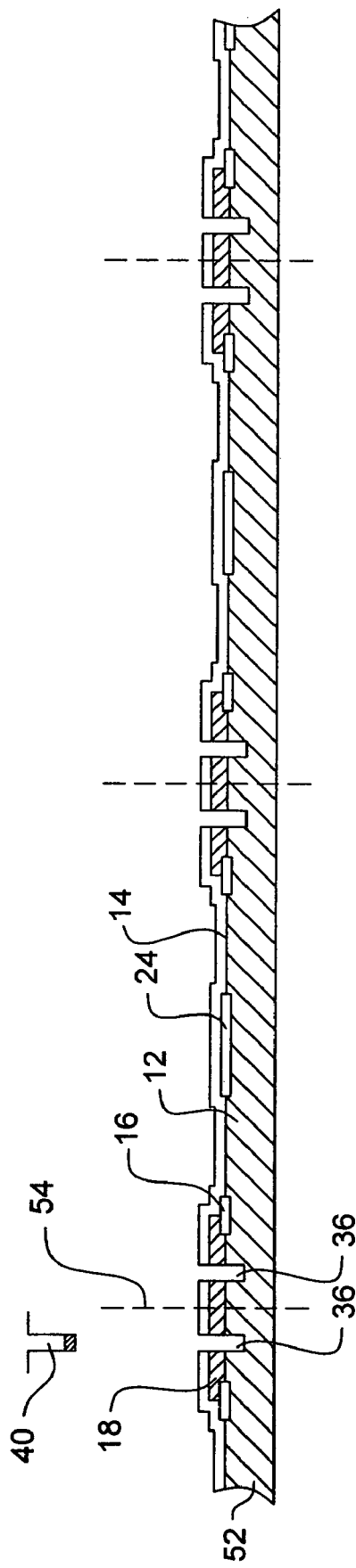

Referring to FIG. 6, a plurality of holes 36 are formed through the pad extension traces 18 on the wafer 52 by using a laser drill 40 and each hole 36 has a predetermined depth.

Figure 7:
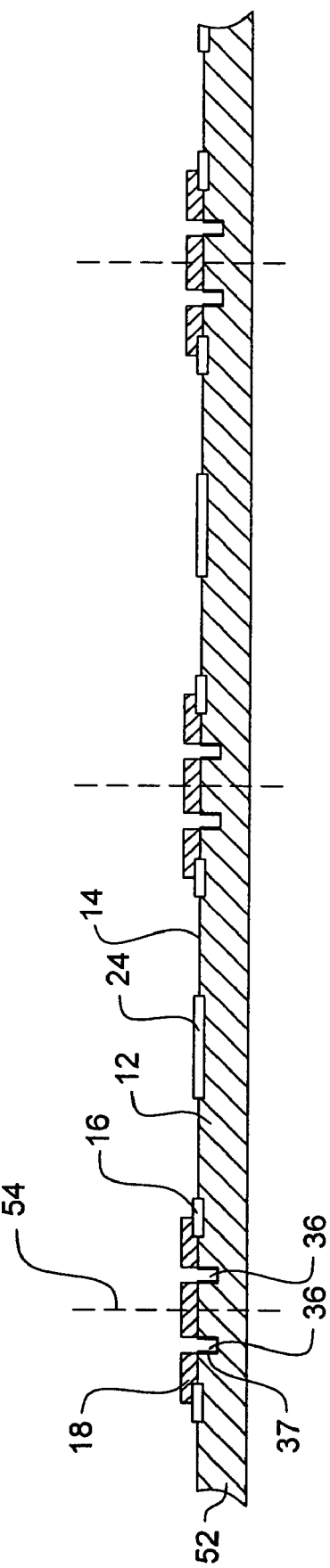

Referring to FIG. 7, the photoresist 20 is striped off and an insulating layer 37 is formed on the inner surface of each hole 36 with at least one part of the pad extension trace 18 exposed therefrom.

Referring to FIG. 8, a conductive material such as copper (Cu) is deposited into the plurality of holes 36 by photmasking and sputtering processes so as to form a plurality of via holes 28. The via holes 28 are electrically connected to the pad extension traces 18. Alternatively, the conductive material can also be plated just on the inner surface of each hole 36 so as to form the via holes 28 electrically connected to the pad extension traces 18.

Referring to FIG. 9, a lid 22 is attached to the wafer 52 through an adhesive layer 26 and covers the active surface 14 of the chip 12 and the plurality of pad extension traces 18. The lid 22 may be made of transparent material, such as glass, acrylic resin or sapphire, so that light can be transmitted through the lid 22 and interact with the optical component 24 of the semiconductor chip 12.

Referring to FIG. 10, the back surface 13 of the wafer 52 is ground by a mechanical grinding wheel or chemical grinding process so as to reduce the thickness of the wafer 52 to a predetermined thickness and make the via holes 28 exposed out of the back surface 13 of the chip 12.

According to one embodiment of the present invention, the plurality of holes 36 can be directly formed through the chip 12 such that the formed via holes 28 can be directly exposed out of the back surface 13. It could be understood by the skill in the art that the wafer 52 can be made to have a predetermined thickness in advance so as to eliminate the above grinding step, or be ground to a predetermined thickness right after forming the via holes 28.

Referring to FIG. 11, a plurality of compliant pads 32 are formed on the back surface 13 of the chip 12 by a thin-film deposition process and a photolithography and etching process. The compliant pads 32 can be made of photosensitive benzocyclobutene (BCB) resin.

Referring to FIG. 12, a plurality of metal traces 38 are formed on the back surface 13 of the chip 12 and the plurality of compliant pads 32 by a thin-film deposition process and a photolithography and etching process, and respectively connected to the via holes 28.

Referring to FIG. 13, a cutting blade 60 cuts the back surface 13 of the wafer 52 along predetermined paths for forming wedged notches 62, thereby forming the inclined side surfaces 15 of the chip 12. The predetermined paths can be correspondent to the scribe lines 54 of the wafer 52.

Referring to FIG. 14, the solder mask 44 is coated on the back surface 13 of the chip 12 and covers the metal traces 38, the side surfaces 15 of the chip 12 and the side surfaces 17 of the pad extension traces 18 with parts of the metal traces 38 exposed therefrom, such that the parts can be defined as a plurality of solder pads 42 and corresponding to the compliant pads 32. The solder mask 44 can be formed by photosensitive benzocyclobutene polymer.

Referring to FIG. 15, a plurality of solder balls 30 are respectively disposed on the solder pads 42; then, the wafer 52 is singulated along the predetermined paths to form the semiconductor package 10 as shown in FIG. 1.

Figure 16:
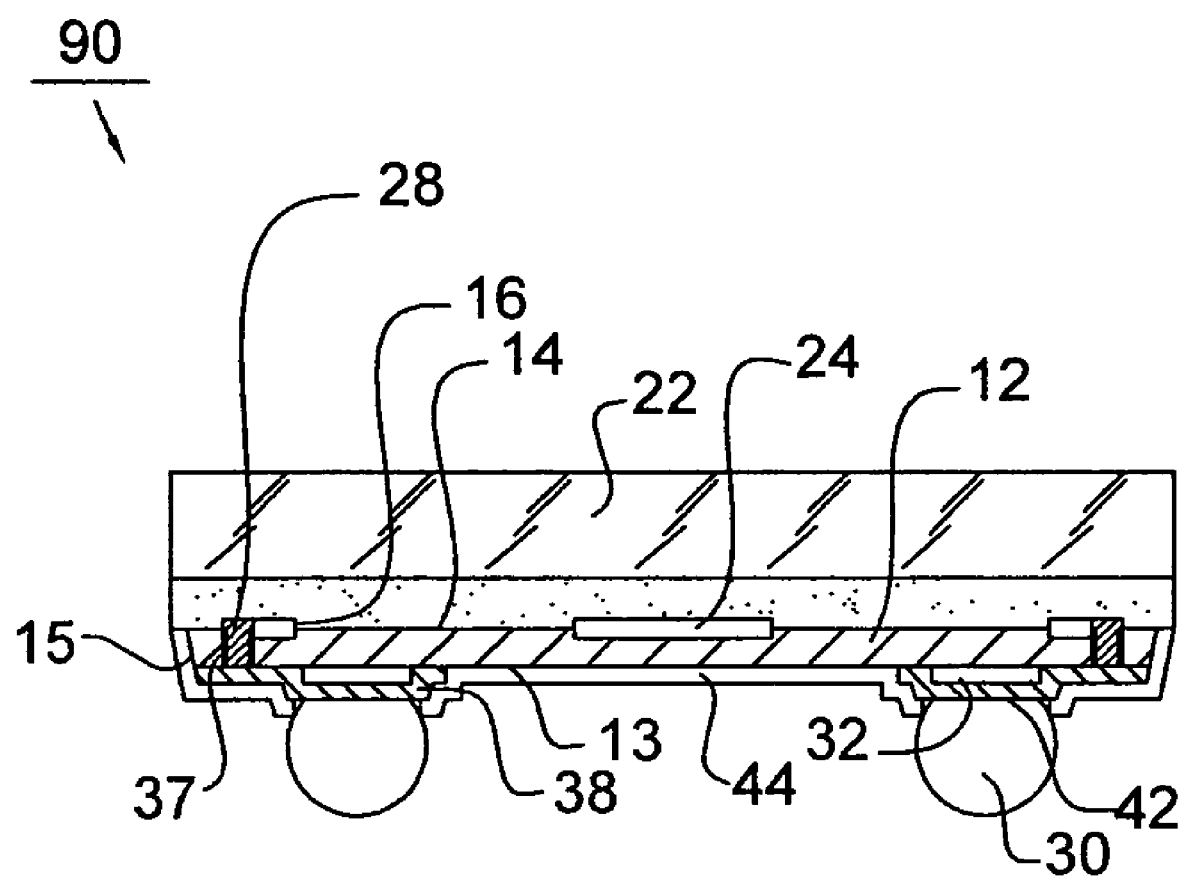
FIG. 16 shows a sectional view of a semiconductor package according to one alternative embodiment of the present invention.

Referring to FIG. 16, it shows a sectional view of a semiconductor package 90 according to one alternative embodiment of the present invention. The semiconductor package 90 is substantially identical to the semiconductor package 10, and its similar elements will be indicated by the same numerals. In the semiconductor package 90, the via holes 28 are formed on and electrically connected to the bonding pads 16.

Therefore, according to the method of the present invention, the semiconductor packages 10, 90 can be massively produced at wafer level thereby reducing the manufacturing cost and improving packaging reliability. Further, the semiconductor packages 10, 90 according to the present invention can be applied to packages for optical components.

Figure 17:
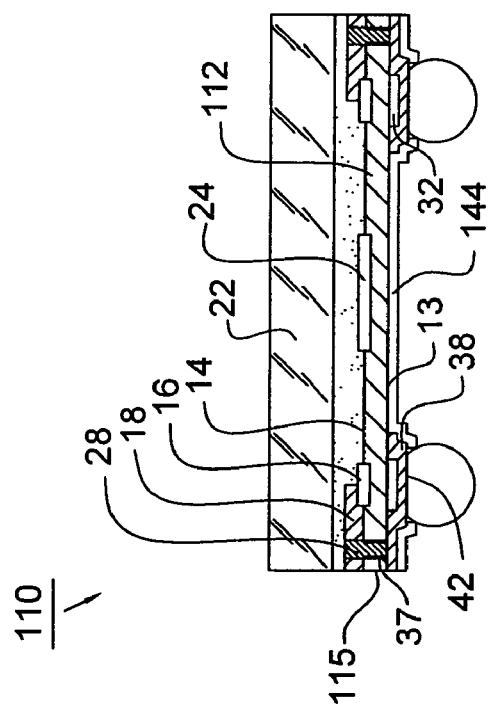
FIG. 17 shows a sectional view of a semiconductor package according to second embodiment of the present invention.

Now referring to FIG. 17, it shows a sectional view of a semiconductor package 110 according to second embodiment of the present invention. The semiconductor package 110 is substantially identical to the semiconductor package 10, and its similar elements will be indicated by the same numerals. The solder mask 144 of the semiconductor package 110 is only coated on the back surface 13 of the chip 112 and not coated on the side surfaces 115 of the same. Further, the chip 112 has vertical side surfaces 115 instead of the inclined side surfaces.

Now referring to FIGS. 2 to 12 and FIGS. 18 to 20, they illustrate a method for manufacturing the semiconductor package 110 according to present invention.

Figure 18:
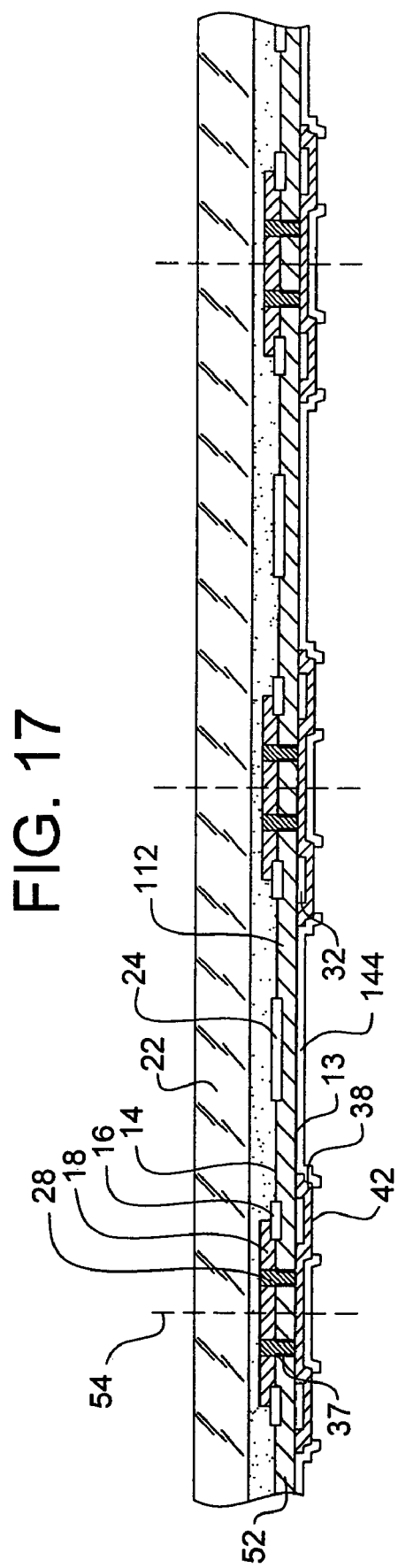
FIGS. 18 to 20 illustrate a method for manufacturing the semiconductor package according to second embodiment of the present invention.

Referring to FIG. 18, a solder mask 144 is coated on the back surface 13 of the wafer 52 with parts of the metal traces 38 exposed therefrom, such that the parts can be defined as a plurality of solder pads 42.

Figure 19:
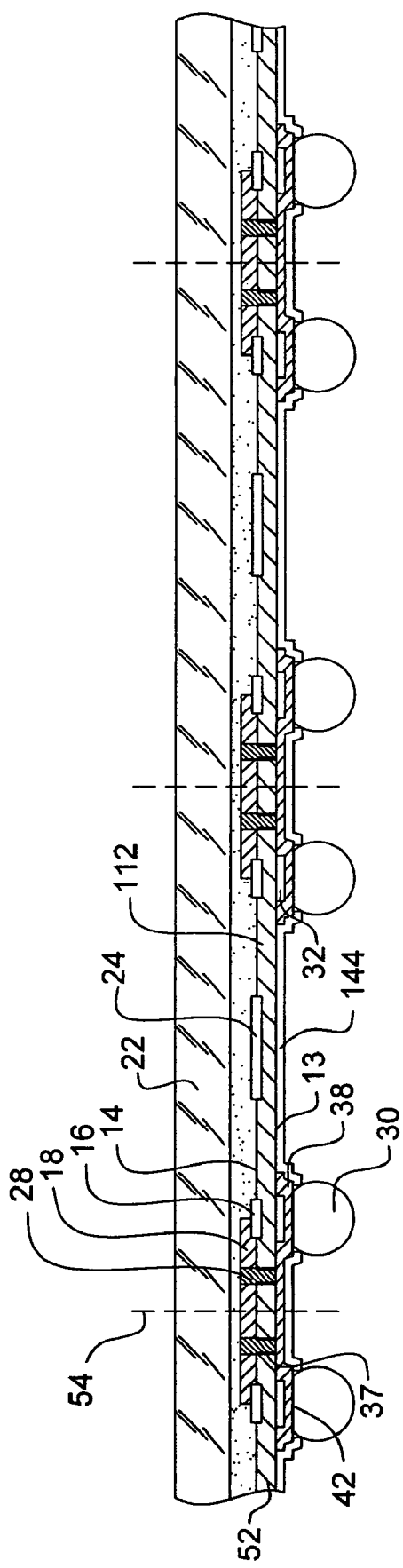

Referring to FIG. 19, a plurality of solder balls 30 are respectively disposed on the solder pads 42.

Figure 20:
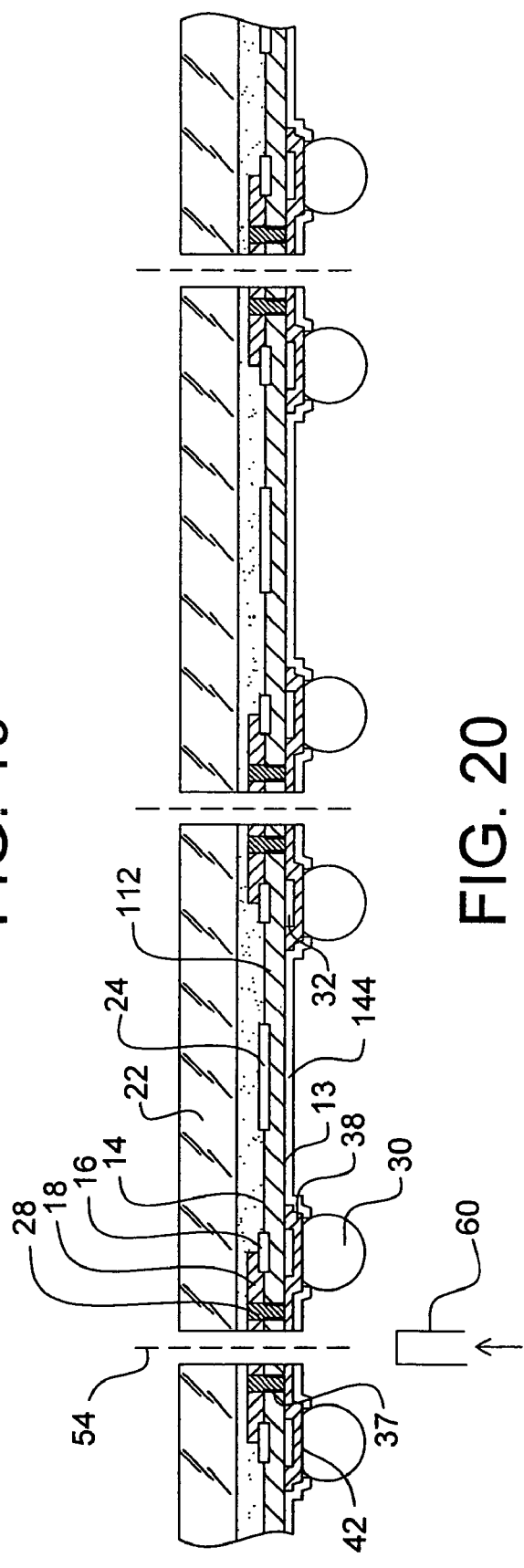

Referring to FIG. 20, a cutting blade 60 cuts the back surface 13 of the wafer 52 along predetermined paths, i.e. along the scribe lines 54 of the wafer 52, thereby forming the individual semiconductor package 110 as shown in FIG. 17.

Figure 21:
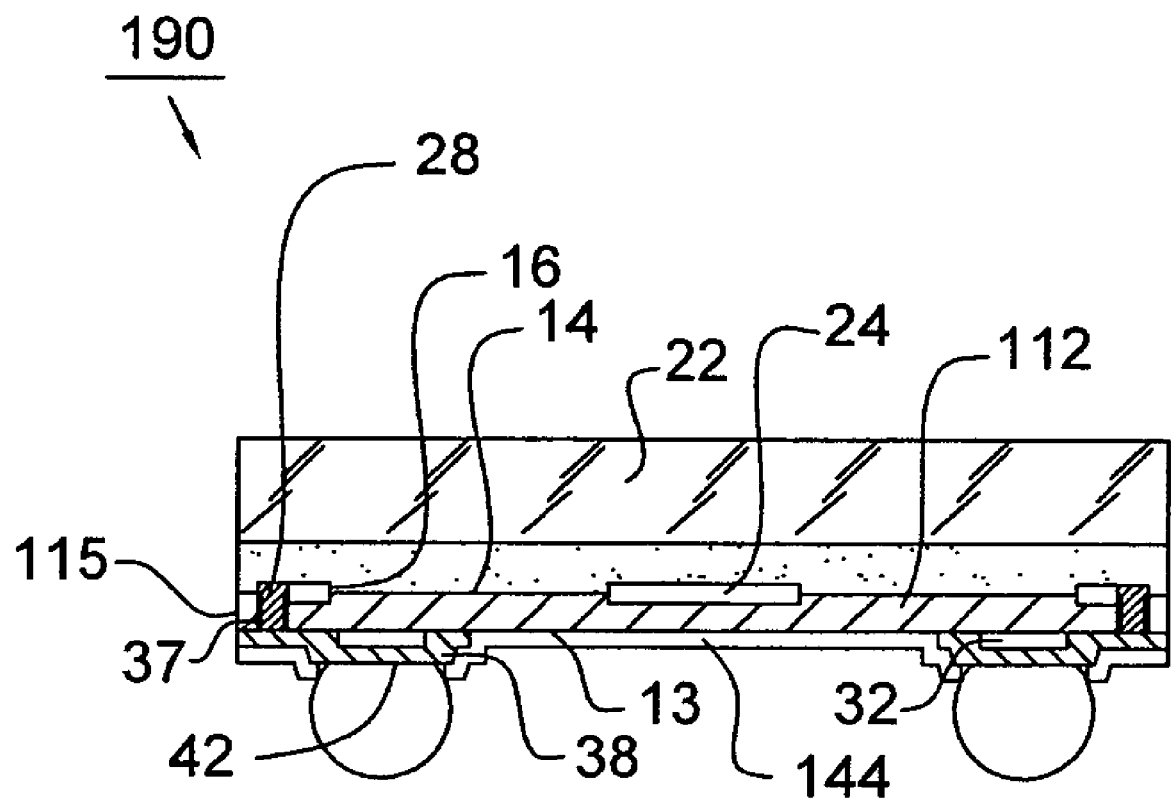
FIG. 21 shows a sectional view of a semiconductor package according to the other alternative embodiment of the present invention.

Now referring to FIG. 21, it shows a sectional view of a semiconductor package 190 according to the other alternative embodiment of the present invention. The semiconductor package 190 is substantially identical to the semiconductor package 110, and its similar elements will be indicated by the same numerals. In the semiconductor package 190, the via holes 28 are formed on and electrically connected to the bonding pads 16.

Figure 22:
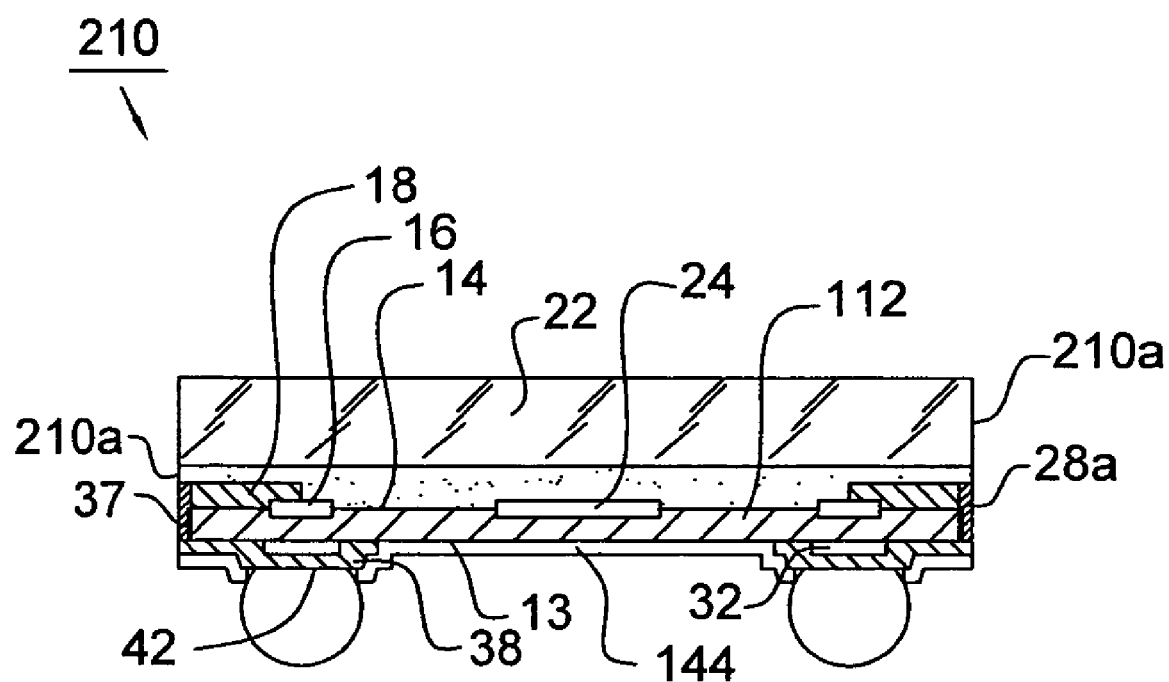
FIG. 22 shows a sectional view of a semiconductor package according to third embodiment of the present invention.

Now referring to FIG. 22, it shows a sectional view of a semiconductor package 210 according to third embodiment of the present invention. The semiconductor package 210 is substantially identical to the semiconductor package 110, and its similar elements will be indicated by the same numerals. In this embodiment, the via holes 28a are exposed out of the side surfaces 210a of the semiconductor package 210.

Now referring to FIGS. 2 to 5 and FIGS. 23 to 32, they illustrate a method for manufacturing the semiconductor package 210 according to present invention.

Referring to FIG. 23, a plurality of holes 36 are formed through the pad extension traces 18 on the scribe lines 54 by using a laser drill 40 and each hole 36 has a predetermined depth.

Referring to FIG. 24, the photoresist 20 is striped off and an insulating layer 37 is formed on the inner surface of each hole 36 according to the same manner illustrated in FIG. 7.

Figure 25:
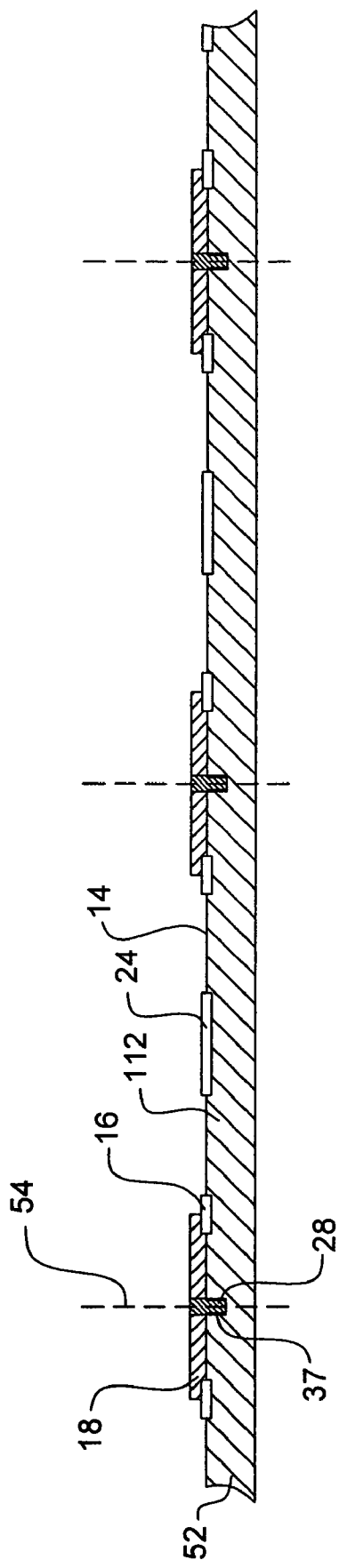

Referring to FIG. 25, a plurality of via holes 28 are formed and electrically connected to the pad extension traces 18 according to the same manner illustrated in FIG. 8.

Figure 26:
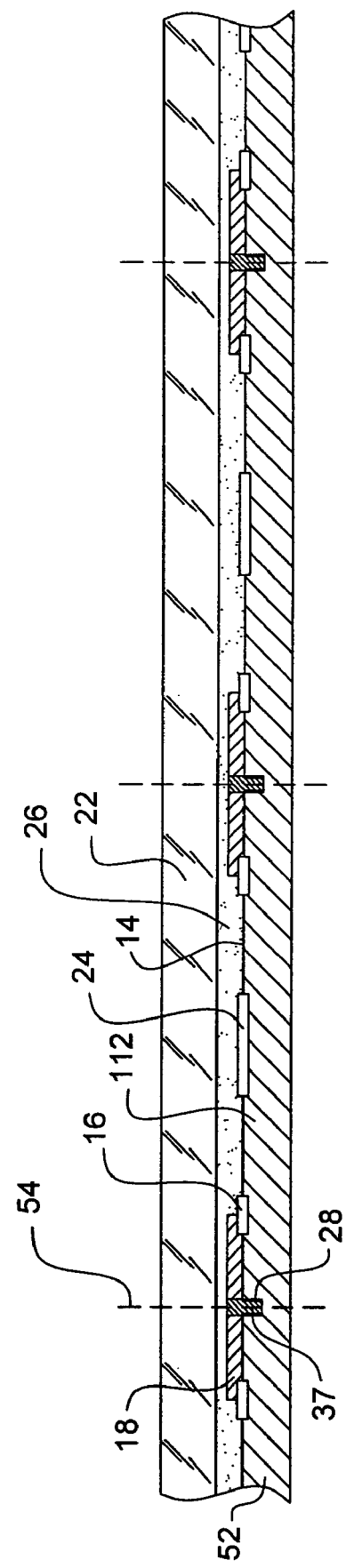

Referring to FIG. 26, a lid 22 is attached to the wafer 52 through an adhesive layer 26 according to the same manner illustrated in FIG. 9.

Referring to FIG. 27, the back surface 13 of the wafer 52 is ground according to the same manner illustrated in FIG. 10 such that the via holes 28 exposed out of the back surface 13 of the chip 12.

Referring to FIG. 28, a plurality of compliant pads 32 are formed on the back surface 13 of the chip 12 according to the same manner illustrated in FIG. 11.

Referring to FIG. 29, a plurality of metal traces 38 are formed on the back surface 13 of the chip 12 and the plurality of compliant pads 32 according to the same manner illustrated in FIG. 12.

Referring to FIG. 30, a solder mask 144 is coated on the back surface 13 of the wafer 52 according to the same manner illustrated in FIG. 18 such that a plurality of solder pads 42 are defined.

Referring to FIG. 31, a plurality of solder balls 30 are respectively disposed on the solder pads 42.

Referring to FIG. 32, a cutting blade 60 cuts the back surface 13 of the wafer 52 along the scribe lines 54 of the wafer 52 thereby forming the individual semiconductor package 210 as shown in FIG. 22. In this step, each via hole 28 is cut into two parts 28a.

Figure 33:
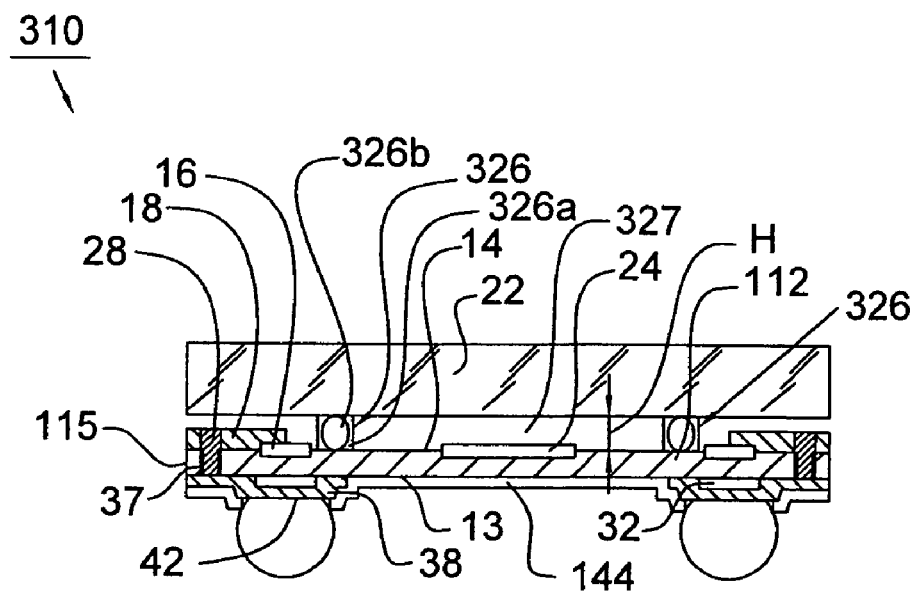
FIG. 33 shows a sectional view of a semiconductor package according to fourth embodiment of the present invention.

Now referring to FIG. 33, it shows a sectional view of a semiconductor package 310 according to fourth embodiment of the present invention. The semiconductor package 310 is substantially identical to the semiconductor package 110, and its similar elements will be indicated by the same numerals. In this embodiment, the lid 22 is attached on the active surface 14 of the chip 112 through an adhesive ring 326 such that light can be transmitted to the optical component 24 or emitted from the optical component 24 without passing the adhesive layer 26 of FIG. 17, thereby improving the light transmitting property within the semiconductor package 310.

Figure 34:
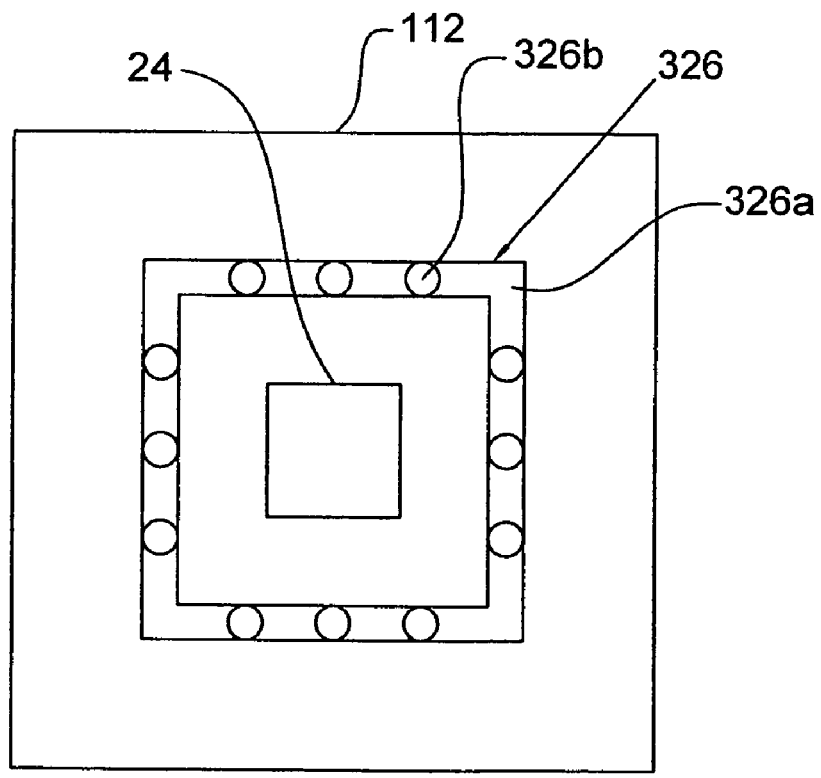
FIG. 34 shows a schematic top view of the adhesive ring disposed on the chip.

Referring to FIG. 34, it shows a schematic top view of the adhesive ring 326 disposed on the chip 112. The adhesive ring 326 is made of an adhesive material 326a having a plurality of spacers 326b mixed thereinto, and disposed around the optical component 24 for attaching the lid 22 on the active surface 14 of the chip 112. The spacers 326b have substantially the same height H to support the lid 22 above the active surface 14 of the chip 112 such that the lid 22 and the chip 112 have a gap formed therebetween. In addition, the lid 22, the chip 112 and the adhesive ring 326 further define a hermetical cavity 327 within which the optical component 24 is disposed.

Now referring to FIGS. 2 to 8 and FIGS. 35 to 38, they illustrate a method for manufacturing the semiconductor package 310 according to present invention.

Referring to FIG. 35, a plurality of adhesive rings 326 are respectively formed on the active surface 14 of each chip 112. The adhesive ring 326 is made of an adhesive material 326a having a plurality of spacers 326b mixed thereinto, and disposed around the optical component 24 on the active surface 14 of the chip 112 as shown in FIG. 34. Preferably, the spacers 326b have substantially the same size or same height H.

Referring to FIG. 36, a lid 22 is attached to the wafer 52 through the plurality of adhesive rings 326 and covers the active surface 14 of the chip 12 and the plurality of pad extension traces 18. Since the spacers 326b of the adhesive rings 326 have the same height H, the lid 22 can be supported above the active surface 14 of the chip 12. Further, the lid 22, the chip 112 and the adhesive ring 326 define a hermetical cavity 327 within which the optical component 24 is disposed.

According to another embodiment of the present invention, the plurality of adhesive rings 326 can be formed on the lid 22 and then attached to the active surface 14 of each chip 112 so as to form the same structure as shown in FIG. 36.

Figure 37:
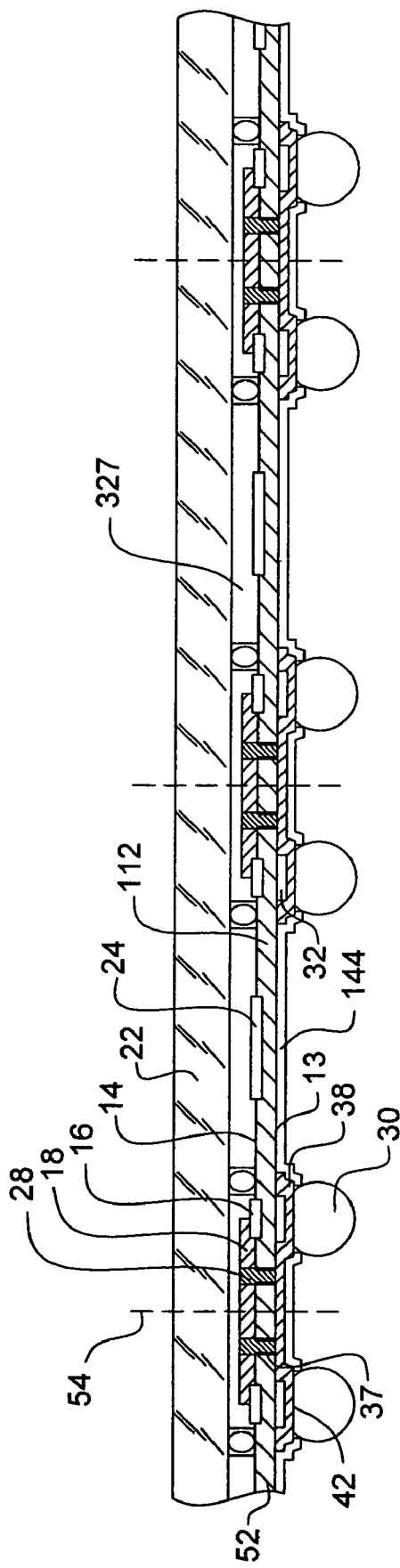

In next steps, the back surface 13 of the wafer 52 is ground, followed by the formations of a plurality of compliant pads 32, a plurality of metal traces 38, a solder mask 144 and a plurality of solder balls 30, according to the same manners illustrated in FIGS. 10-12 and FIGS. 18-19 so as to form a structure as shown in FIG. 37.

Figure 38:
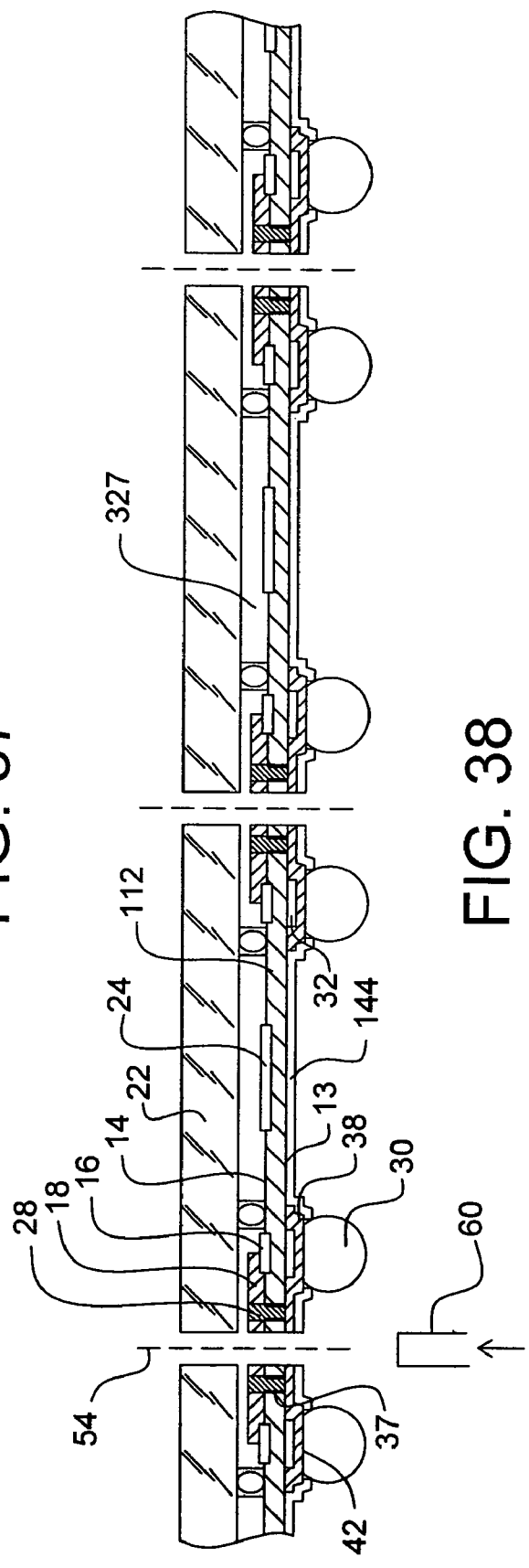

Referring to FIG. 38, a cutting blade 60 cuts the back surface 13 of the wafer 52 along the scribe lines 54, thereby forming the individual semiconductor package 310 as shown in FIG. 33.

Figure 39:
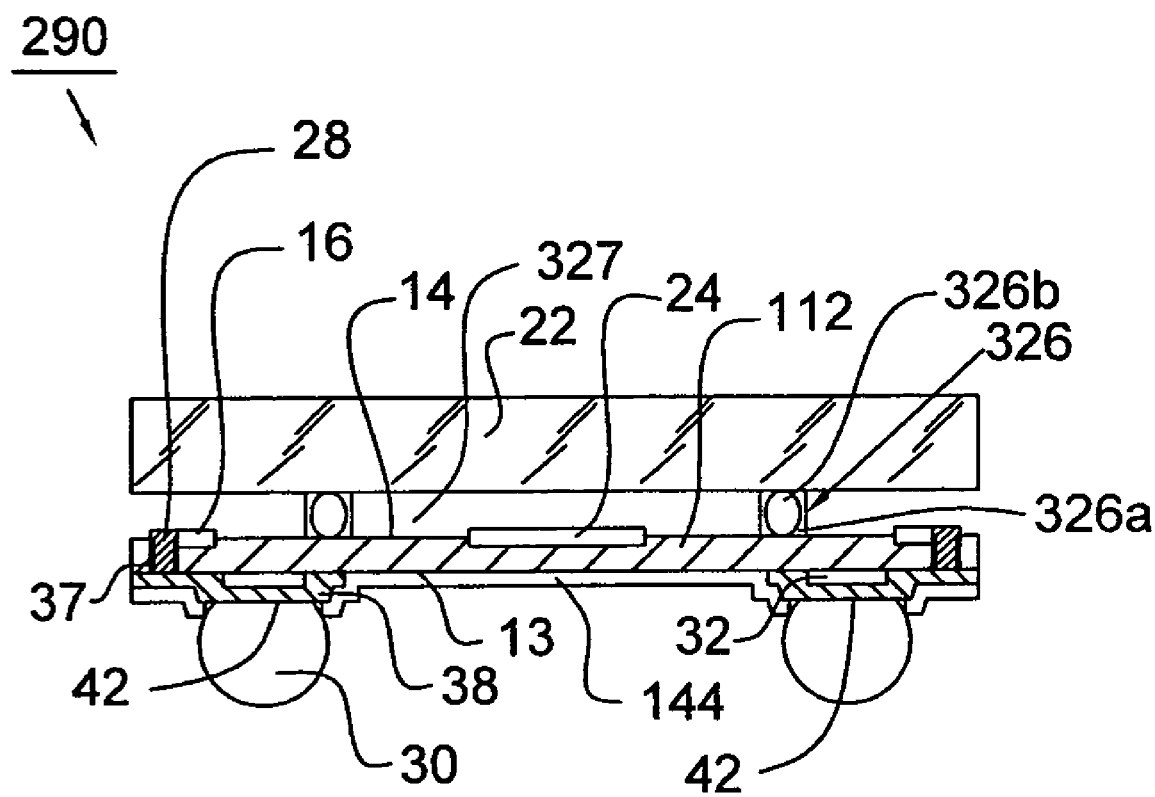
FIG. 39 shows a sectional view of a semiconductor package according to the other alternative embodiment of the present invention.

Now referring to FIG. 39, it shows a sectional view of a semiconductor package 290 according to the other alternative embodiment of the present invention. The semiconductor package 290 is substantially identical to the semiconductor package 190 as shown in FIG. 21, and its similar elements will be indicated by the same numerals. In the semiconductor package 290, the lid 22 is attached to the active surface 14 of the chip 112 by an adhesive ring 326 according to the same manner as illustrated in FIGS. 33 and 34.

Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. A method for manufacturing semiconductor packages comprising following steps:
providing a wafer defining an active surface and a back surface opposite to the active surface, the wafer having a plurality of chips and a plurality of scribe lines formed among the chips wherein each chip has an optical component disposed on the active surface and a plurality of bonding pads disposed on the active surface and electrically connected to the optical component;
forming a plurality of first holes through the bonding pads on the chips of the wafer;
forming a conductive material within the plurality of first holes to form a plurality of via holes electrically connected to the bonding pads;
providing a lid to be attached to the wafer and cover the active surface of the wafer;
forming a plurality of metal traces on the back surface of the wafer, the metal traces being electrically connected to the via holes and defining a plurality of solder pads thereon;
forming a plurality of adhesive rings respectively around the optical components for attaching the lid to the wafer, wherein each adhesive ring is made of an adhesive material having a plurality of spacers mixed thereinto; and
cutting the wafer to form a plurality of individual semiconductor packages.

2. The method as claimed in claim 1, further comprising a step of forming an insulating layer on the inner surface of each first hole.

3. The method as claimed in claim 1, further comprising following steps:
coating a photoresist on the active surface of the chip and the bonding pads before the step of forming the first holes; and
stripping off the photoresist after the step of forming the first holes.

4. The method as claimed in claim 1, further comprising a step of grinding the back surface of the wafer so as to reduce the thickness of the wafer to a predetermined thickness and make the via holes exposed out of the back surface.

5. The method as claimed in claim 1, further comprising a step of forming a plurality of compliant pads on the back surface of the chip wherein the compliant pads are corresponding to the solder pads.

6. The method as claimed in claim 1, further comprising following steps:
cutting the back surface of the wafer along the scribes lines to form a plurality of wedged notches; and
coating a solder mask on the back surface of the chip and the wedged notches with the solder pads of the metal traces exposed therefrom.

7. The method as claimed in claim 1, further comprising a step of disposing a plurality of solder balls on the solder pads of the metal traces.

8. The method as claimed in claim 1, wherein the spacer is in the shape of a ball.

9. The method as claimed in claim 8, wherein the spacer is spherical in shape.

10. A method for manufacturing semiconductor packages comprising following steps:
providing a wafer defining an active surface and a back surface opposite to the active surface, the wafer having a plurality of chips and a plurality of scribe lines formed among the chips wherein each chip has an optical component disposed on the active surface and a plurality of bonding pads disposed on the active surface and electrically connected to the optical component;
forming a plurality of pad extension traces on the active surface of the wafer, the pad extension traces respectively and electrically connected to the bonding pads;
forming a plurality of first holes through the pad extension traces on the wafer;
forming a conductive material within the plurality of first holes to form a plurality of via holes electrically connected to the pad extension traces;
providing a lid to be attached to the wafer and cover the active surface of the wafer;
forming a plurality of metal traces on the back surface of the wafer, the metal traces being electrically connected to the via holes and defining a plurality of solder pads thereon;
forming a plurality of adhesive rings respectively around the optical components for attaching the lid to the wafer, wherein each adhesive ring is made of an adhesive material having a plurality of spacers mixed thereinto; and
cutting the wafer to form a plurality of individual semiconductor packages.

11. The method as claimed in claim 10, further comprising a step of forming an insulating layer on the inner surface of each first hole.

12. The method as claimed in claim 10, wherein the plurality of first holes are formed through the pad extension traces on the scribe lines of the wafer.

13. The method as claimed in claim 10, further comprising a step of grinding the back surface of the wafer so as to reduce the thickness of the wafer to a predetermined thickness and make the via holes exposed out of the back surface.

14. The method as claimed in claim 10, further comprising a step of forming a plurality of compliant pads on the back surface of the chip wherein the compliant pads are corresponding to the solder pads.

15. The method as claimed in claim 10, further comprising following steps:
cutting the back surface of the wafer along the scribes lines to form a plurality of wedged notches; and
coating a solder mask on the back surface of the chip and the wedged notches with the solder pads of the metal traces exposed therefrom.

16. The method as claimed in claim 10, further comprising a step of disposing a plurality of solder balls on the solder pads of the metal traces.

17. The method as claimed in claim 10, wherein the spacer is in the shape of a ball.

18. The method as claimed in claim 17, wherein the spacer is spherical in shape.

* * * * *